United States Patent
Fan et al.

(10) Patent No.: US 7,676,700 B2
(45) Date of Patent: Mar. 9, 2010

(54) SYSTEM FOR TESTING HARD DISKS

(75) Inventors: Chiou-Lin Fan, Taipei Hsien (TW);
Ying-Chih Huang, Taipei Hsien (TW);
Chin-Feng Chen, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 292 days.

(21) Appl. No.: 11/759,242

(22) Filed: Jun. 7, 2007

(65) Prior Publication Data

US 2008/0074107 A1 Mar. 27, 2008

(30) Foreign Application Priority Data

Sep. 22, 2006  (CN) .................. 2006 1 0062730

(51) Int. Cl.
*G06F 11/00* (2006.01)
(52) U.S. Cl. ................... 714/42; 714/718; 324/212
(58) Field of Classification Search ................ None
See application file for complete search history.

(56) References Cited

U.S. PATENT DOCUMENTS

| | | | | |
|---|---|---|---|---|
| 5,615,335 A * | 3/1997 | Onffroy et al. ............. 714/30 |
| 5,761,411 A * | 6/1998 | Teague et al. .............. 714/47 |
| 5,893,048 A * | 4/1999 | Pate et al. .................. 702/56 |
| 6,282,501 B1 * | 8/2001 | Assouad .................... 702/117 |
| 6,408,406 B1 * | 6/2002 | Parris ....................... 714/41 |
| 6,434,499 B1 | 8/2002 | Ulrich et al. |
| 6,651,192 B1 * | 11/2003 | Viglione et al. ............ 714/47 |
| 7,248,040 B2 * | 7/2007 | Makifuchi et al. .......... 324/212 |
| 7,451,354 B2 * | 11/2008 | Kalos et al. ................ 714/42 |
| 2002/0053046 A1 * | 5/2002 | Gray et al. ................ 714/42 |
| 2004/0216017 A1 * | 10/2004 | Chu ........................ 714/718 |
| 2005/0066105 A1 * | 3/2005 | Hsu et al. ................. 710/305 |
| 2005/0071117 A1 * | 3/2005 | Escobar et al. ............ 702/132 |
| 2005/0251359 A1 * | 11/2005 | Cao et al. ................. 702/120 |
| 2006/0061356 A1 * | 3/2006 | Makifuchi et al. .......... 324/212 |
| 2007/0028216 A1 * | 2/2007 | Boss et al. ................ 717/124 |
| 2008/0104449 A1 * | 5/2008 | Farren et al. .............. 714/42 |
| 2008/0306991 A1 * | 12/2008 | Kalos et al. ............... 707/102 |

FOREIGN PATENT DOCUMENTS

TW    I246010    12/2005

* cited by examiner

*Primary Examiner*—Christopher S McCarthy
(74) *Attorney, Agent, or Firm*—Frank R. Niranjan

(57) ABSTRACT

A system for testing hard disks includes a hard disk testing device and a computer. The computer has a mainboard and a key-press controller. The hard disk testing device connects with the mainboard and includes: a hard disk interface configured for connecting one or more hard disks to be tested to a south bridge of the mainboard; a key-press panel configured for connecting the key-press controller of the computer, and providing a hard disk testing control interface for users; and a hard disk testing unit configured for testing the one or more hard disks.

7 Claims, 4 Drawing Sheets

SYSTEM FOR TESTING HARD DISKS

BACKGROUND OF THE INVENTION

1. Field of the Invention

The present invention relates to a system for testing hard disks.

2. Description of Related Art

Hard disks of computers may store a mass of data, including user data and system data, such as operating system, application software and so on. As the market demand for computers grow, more and more hard disk are needed. Before a hard disk is put into the market, the hard disk should pass a factory acceptance test. Such tests involve actions such as, formatting the hard disk, writing data into the hard disk, deleting the data from the hard disk, and so on.

Conventionally, the hard disk is tested through a test software. The test software is installed in a computer and the hard disk to be tested is also installed in the computer. The computer tests the general functions of the hard disk through the test software.

Under the circumstances of when a plurality of hard disks need to be tested, the plurality of hard disks will need to be installed in the computer one by one. Due to the need of one by one installation when a plurality of hard disks need to be tested, the computer in use for testing may easily sustain damage and the amount of time that would be spent on testing is wasteful.

Therefore, what is needed is a system for testing hard disks. The system can test the performances of the hard disks conveniently, thus decreasing test time and enhancing efficiency.

SUMMARY OF THE INVENTION

A system for testing hard disks includes a hard disk testing device and a computer. The computer has a mainboard and a key-press controller. The hard disk testing device connects with the mainboard and the hard disk testing device includes: a hard disk interface configured for connecting one or more hard disks to be tested to a south bridge of the mainboard; a key-press panel configured for connecting the key-press controller of the computer and for providing a hard disk testing control interface for users; and a hard disk testing unit configured for testing the one or more hard disks.

Other advantages and novel features of the embodiments will be drawn from the following detailed description with reference to the attached drawings.

DETAILED DESCRIPTION OF THE INVENTION

Figure 1:
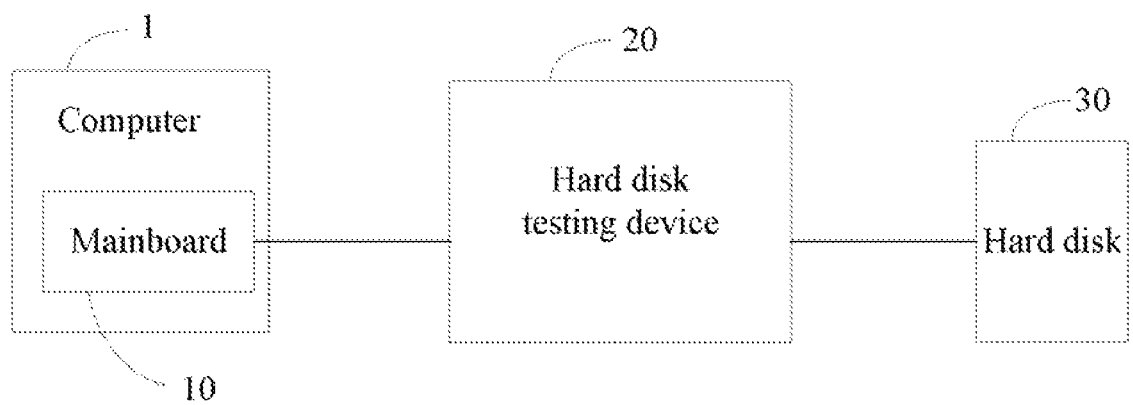
FIG. 1 is a schematic diagram of hardware configuration of a system for testing hard disks in accordance with one embodiment.

FIG. 1 is a schematic diagram of a hardware configuration of a system for testing hard disks (hereinafter, "the system") in accordance with one embodiment. The system typically includes a computer 1 and a hard disk testing device 20. The hard disk testing device 20 is connected with one or more hard disks 30 to be tested (only one shown). The computer 1 includes a mainboard 10. The hard disk testing device 20 is connected to the mainboard 10 for testing the hard disk 30. The hard disk 30 may be a 3.5-inch hard disk, a 2.5-inch hard disk, or a 1.8-inch hard disk. In another embodiments, a plurality of hard disks 30 can be tested by the hard disk testing device 20 synchronously.

Figure 2:
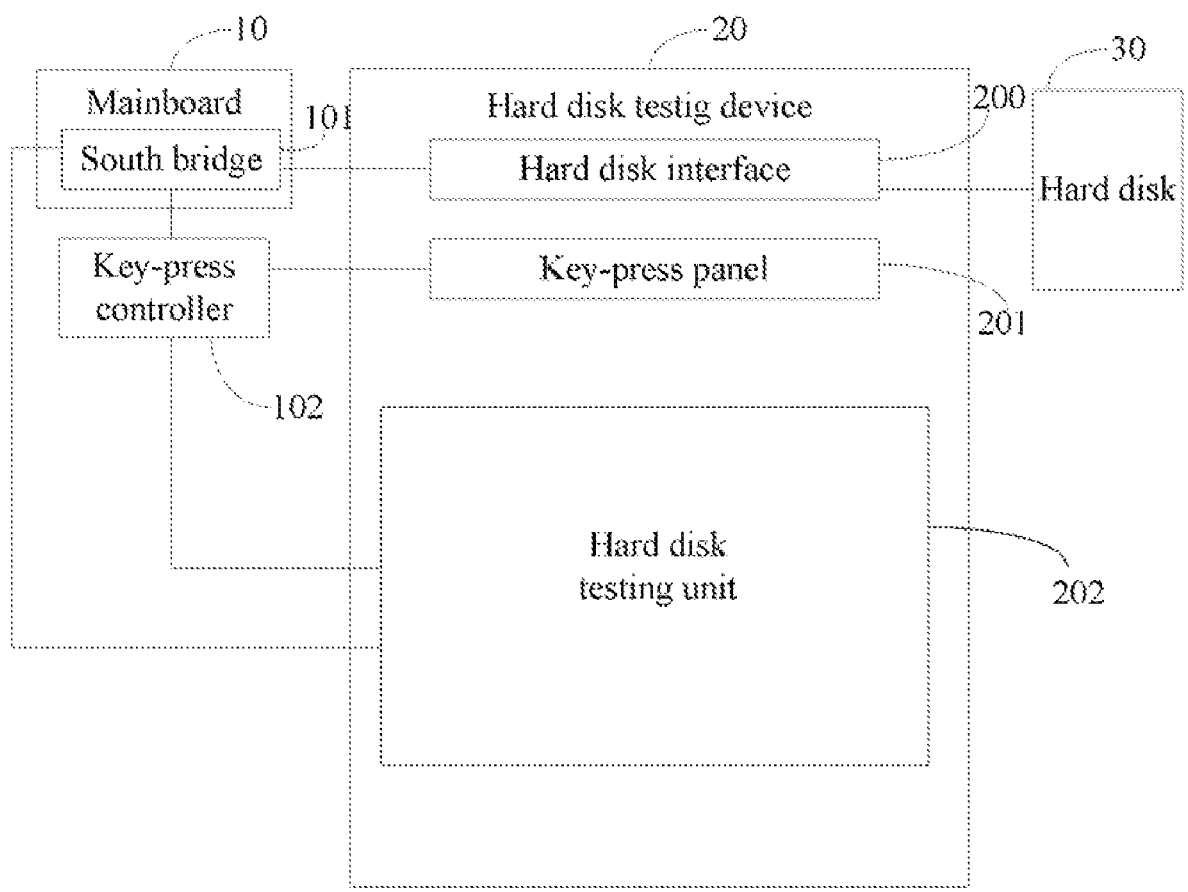
FIG. 2 is a schematic diagram illustrating detailed configuration of the system of FIG. 1.

FIG. 2 is a schematic diagram illustrating detailed configuration of the system of FIG. 1. The mainboard 10 in the computer 1 includes a south bridge 101, and the mainboard 10 connects with a key-press controller 102. The hard disk testing device 20 typically includes a hard disk interface 200, a key-press panel 201, and a hard disk testing unit 202.

The hard disk interface 200 is configured for connecting the hard disk 30 to be tested to the south bridge 101 of the mainboard 10. The hard disk interface 200 may be an integrated drive electronics (IDE) interface, a serial ATA (SATA) interface, or any other suitable interface that corresponds to the hard disk 30 to be tested.

The key-press panel 201 connects with the key-press controller 102 and is configured for providing a hard disk testing control interface for users. The key-press panel 201 may be an ordinary key-press panel, such as a keyboard of a computer or a touch screen panel. The key-press controller 102 may be a control card or a control unit built in a PCI slot of the mainboard 10. The key-press controller 102 is configured for receiving hard disk test information from the key-press panel 201, transmitting the test information to the south bridge 101 and conveying control information of the south bridge 101 to the hard disk testing unit 202, for testing general functions of the hard disk 30 according to the control information. The hard disk test information may be format test, disk partition test, data write test, data delete test, rotational speed test, operating system test and so on. The general functions of the hard disk 30 may include format, disk partition, data write, data delete, rotational speed, operating system, and so on.

The hard disk testing unit 202 connects with the south bridge 101 of the mainboard 20 through the key-press controller 102 and is configured for testing the hard disk 30.

Figure 3:
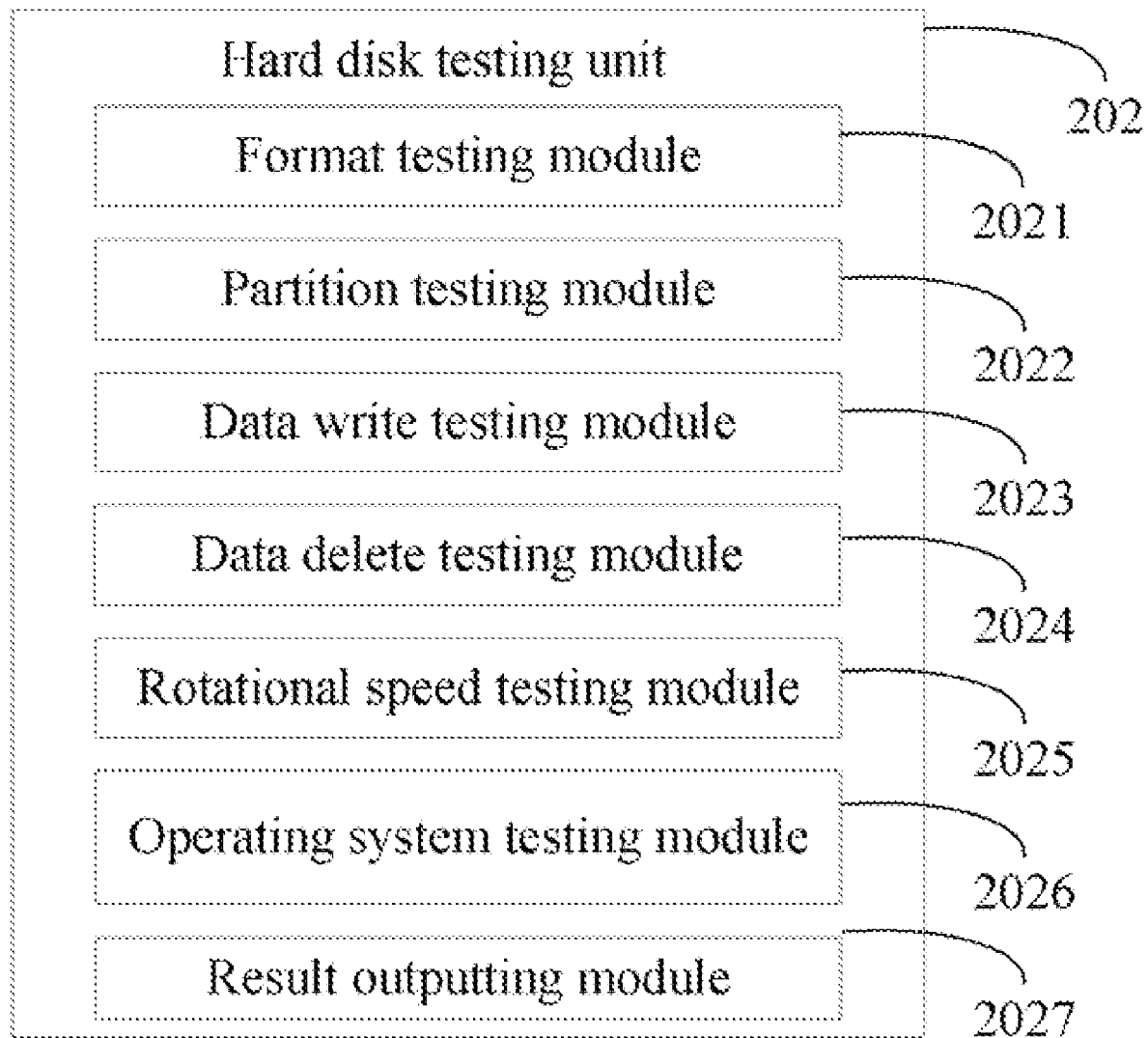
FIG. 3 is a schematic diagram of function modules of a hard disk testing unit in FIG. 2.

FIG. 3 is a schematic diagram of function modules of the hard disk testing unit 202. The hard disk testing unit 202 typically includes a format testing module 2021, a partition testing module 2022, a data write testing module 2023, a data delete testing module 2024, a rotational speed testing module 2025, an operating system testing module 2026, and a result outputting module 2027.

The format testing module 2021 is configured for testing whether the hard disk 30 is able to be formatted. If the format testing module 2021 can format the hard disk 30, then the result outputting module 2027 outputs a test result to show that the formatting function of the hard disk 30 is qualified. If the format testing module 2021 cannot format the hard disk 30, one or more tracks or sectors of the hard disk 30 may be broken, then the result outputting module 2027 outputs a test result to show that the formatting function of the hard disk 30 is not qualified.

The partition testing module 2022 is configured for testing whether the hard disk 30 is able to be partitioned. For managing data stored in a hard disk, the user generally partitions the hard disk as disk C, disk D, disk E, and so on. The disks C, D, E are partitioned according to logical sectors of the hard disk. If the partition testing module 2022 can partition the hard disk 30, the result outputting module 2027 outputs a test result to show that the partition function of the hard disk 30 is qualified. If the partition testing module 2022 cannot partition the hard disk 30, the result outputting module 2027 outputs a test result to show that the partition function of the hard disk 30 is not qualified.

The data write testing module 2023 is configured for testing whether the hard disk 30 is able to be written with data. If the data write testing module 2023 can write data into the hard disk 30, the result outputting module 2027 outputs a test result to show that the data writing function of the hard disk 30 is qualified. If the data write testing module 2023 cannot write data into the hard disk 30, the result outputting module 2027 outputs a test result to show that the data writing function of the hard disk 30 is not qualified.

The data delete testing module 2024 is configured for testing whether the data in the hard disk 30 is able to be deleted. If the data delete testing module 2024 can delete data from the hard disk 30, the result outputting module 2027 outputs a test result to show that the data deleting function of the hard disk 30 is qualified. If the data delete testing module 2024 cannot delete data from the hard disk 30, the result outputting module 2027 outputs a test result to show that the data deleting function of the hard disk 30 is not qualified.

The rotational speed testing module 2025 is configured for testing whether the rotational speed of the hard disk 30 is standard. Each hard disk has a standard rotational speed. For example, a hard disk of a personal computer (PC) may have a standard rotational speed of 5400 revolutions per minute (RPM). A hard disk of a server has a standard rotational speed of 10,000 RPM. The rotational speed testing module 2025 computes revolution times of the hard disk 30 in a unit interval and calculates the rotational speed according to the revolution times. For computing the revolution times, the hard disk testing device 20 can be connected with a revolution times testing device, such as an infrared testing device, for eradiating infrared to the hard disk 30 and incepting reflection of the eradiated infrared. Herein, the rotational speed testing module 2025 computes the revolution times according to the reflection. Furthermore, the rotational speed testing module 2025 can also be connected with an inductor for computing the revolution times. If the rotational speed testing module 2025 tests that the rotational speed of the hard disk 30 is standard, the result outputting module 2027 outputs a test result to show that rotational speed of the hard disk 30 is qualified. Otherwise, if the rotational speed testing module 2025 tests that the rotational speed of the hard disk 30 is not standard, the result outputting module 2027 outputs a test result to show that the rotational speed of the hard disk 30 is not qualified.

The operating system testing module 2026 is configured for installing an operating system into the hard disk 30, and testing whether the operating system can operate normally. In the present embodiment, the operating system, such as the Linux, may be a backup file package stored in the hard disk testing device 20. The operating system testing module 2026 invokes the backup file package and installs the operating system into the hard disk 30. After the operating system is installed, the user can operate the operating system (such as starting up the computer 1, or shutting down the computer 1). If the operating system operates normally, the result outputting module 2027 outputs a test result to show that the performance of the operating system of the hard disk 30 is qualified. If the operating system operates abnormally, the result outputting module 2027 outputs a test result to show that the performance of the operating system of the hard disk 30 is not qualified.

The result outputting module 2027 is configured for outputting test results. The test results show whether the general functions of the hard disk 30 are qualified or not qualified. Usually, the test results can be displayed via a liquid crystal display (LCD) or a monitor of the computer 1. Furthermore, the test results can also be display via a low emitting diode (LED) built on the hard disk testing device 20. For example, a green light of the LED shows a qualified test result and a red light of the LED shows an unqualified test result.

Figure 4:
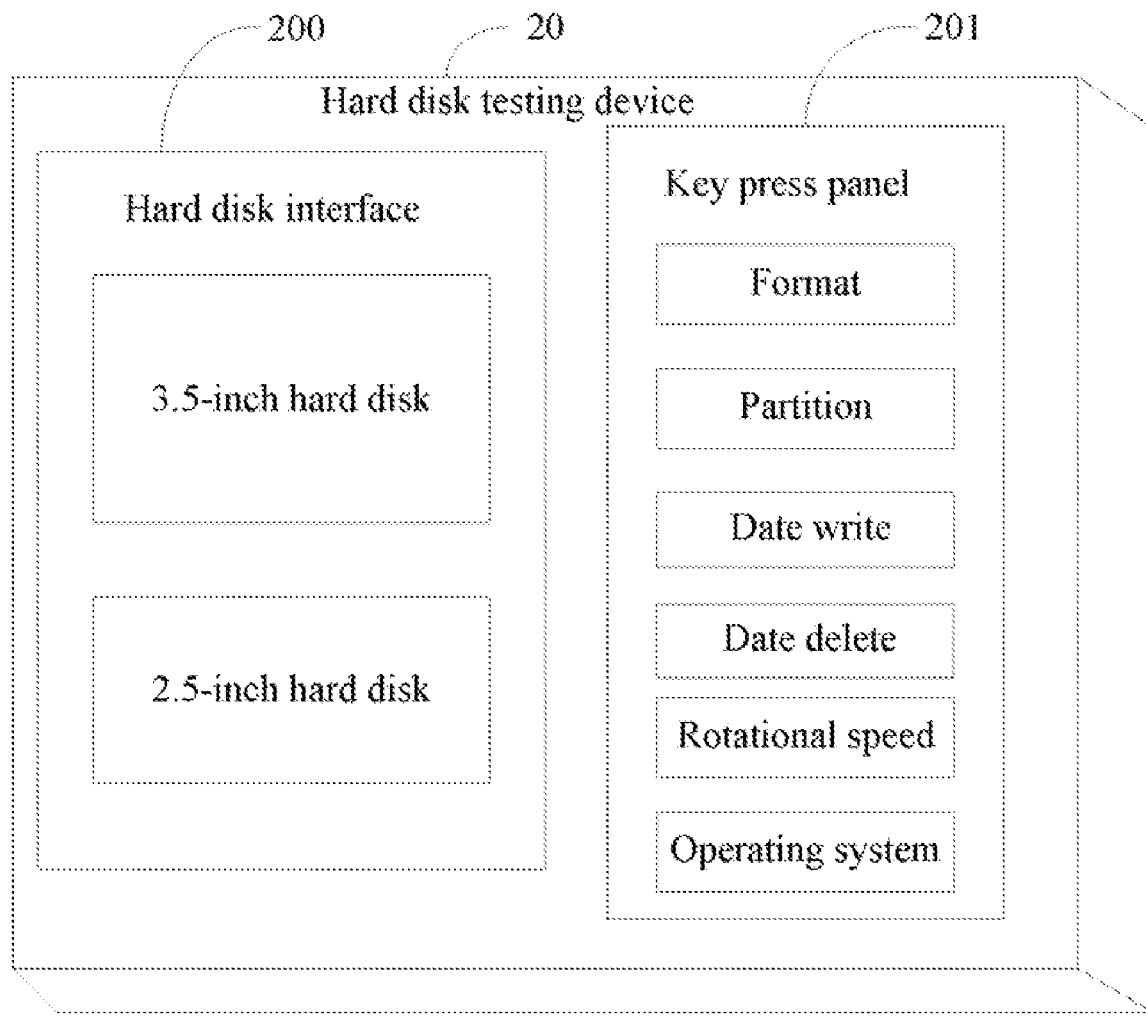
FIG. 4 is a schematic diagram illustrating an interface of the hard disk testing device in accordance with another embodiment.

FIG. 4 is a schematic diagram illustrating an interface of the hard disk testing device 20 in accordance with another embodiment. In this embodiment, for testing the two hard disks 30 synchronously, the hard disk interface 200 of the hard disk testing device 20 connects with two hard disks 30 to be tested (a 2.5-inch hard disk and a 3.5-inch hard disk). The key-press panel 201 includes key-presses "Format", "Partition", "Data write", "Data delete", "Rotational speed", and "Operating system", respectively, corresponding to the format testing module 2021, the partition testing module 2022, the data write testing module 2023, the data delete testing module 2024, the rotational speed testing module 2025, and the operating system testing module 2026. The user can test the general functions of the hard disks 30 via pressing the corresponding key-presses.

The implementation of the system can be better illustrated by an example as follows. If a user tests a 3.5-inch hard disk, the user connects the 3.5-inch hard disk to the hard disk interface 200. Following the connection of the 3.5-inch hard disk to the hard disk interface 200, the user presses the key-presses to test general functions of the 3.5-inches hard disk. For example, the user presses the key-press "Format" to test whether the hard disk 30 can be formatted. The key-press controller 102 receives test information from the key-press panel 201 and controls the format testing module 2021 of the hard disk testing unit 202 to test the hard disk 30.

It is to be understood, however, that even though numerous characteristics and advantages of the indicated invention have been set forth in the foregoing description, together with details of the structure and function of the invention, the disclosure is illustrative only and changes may be made in details, especially in matters of shape, size and arrangement of parts within the principles of the invention to the full extent indicated by the broad general meaning of the terms in which the appended claims are expressed.

What is claimed is:

1. A system for testing hard disks, the system comprising a hard disk testing device and a computer, the computer having a mainboard and a key-press controller, the hard disk testing device being connected with the mainboard and comprising:

a hard disk interface configured for connecting one or more hard disks to be tested to a south bridge of the mainboard;

a key-press panel configured for connecting the key-press controller of the computer, and providing a hard disk testing control interface for users; and a hard disk testing unit configured for testing the one or more hard disks;

the key-press controller of the computer configured for receiving test information from the key-press panel, transmitting the test information to the south bridge, and conveying control information of the south bridge to the hard disk testing unit for testing the one or more hard disks according to the control information.

2. The system according to claim 1, wherein the hard disk testing unit comprises:

a format testing module configured for testing whether the one or more hard disks to be tested are able to be formatted;

a partition testing module configured for testing whether the one or more hard disks to be tested are able to be partitioned;

a data write testing module configured for testing whether the one or more hard disks to be tested are able to be written with data;

a data delete testing module configured for testing whether data in the one or more hard disks to be tested are able to be deleted;

a rotational speed testing module configured for testing whether rotational speeds of the one or more hard disks to be tested are standard;

an operating system testing module configured for installing an operating system in each of the one or more hard disks to be tested, and testing whether the operating system operates normally; and a result outputting module configured for outputting test results.

3. The system according to claim 2, wherein the test results are output via a liquid crystal display (LCD).

4. The system according to claim 2, wherein the test results are output via one or more light emitting diodes built on the hard disk testing device.

5. The system according to claim 1, wherein the test information comprises: format test, disk partition test, data write test, data delete test, rotational speed test, and operating system test.

6. The system according to claim 1, wherein the key-press panel comprises a keyboard of the computer or a touch screen panel.

7. The system according to claim 1, wherein the key-press controller comprises a control card or a control unit built in a PCI slot of the mainboard.

* * * * *